(12) United States Patent
Liu et al.

(10) Patent No.: US 7,638,265 B2
(45) Date of Patent: Dec. 29, 2009

(54) METHOD FOR MANUFACTURING A MOLD OF A LIGHT GUIDE PLATE

(75) Inventors: Ming-Dah Liu, Hsinchu (TW); Shi-Chi Hou, Hsinchu (TW); Jui-Nien Jao, Hsinchu (TW)

(73) Assignee: Coretronic Corporation, Hsinchu (TW)

( * ) Notice: Subject to any disclaimer, the term of this patent is extended or adjusted under 35 U.S.C. 154(b) by 367 days.

(21) Appl. No.: 11/831,947

(22) Filed: Jul. 31, 2007

(65) Prior Publication Data

US 2008/0070129 A1 Mar. 20, 2008

(30) Foreign Application Priority Data

Sep. 20, 2006 (TW) .............. 95134889 A

(51) Int. Cl.
*G03F 7/00* (2006.01)
(52) U.S. Cl. ............ 430/320; 430/321; 205/70
(58) Field of Classification Search ............ None
See application file for complete search history.

(56) References Cited

U.S. PATENT DOCUMENTS

| 5,776,636 | A | 7/1998 | Kunisawa |
| 2006/0028952 | A1* | 2/2006 | Yu et al. ............ 369/100 |

2006/0118426 A1* 6/2006 Choi ............ 205/271

FOREIGN PATENT DOCUMENTS

JP 2002-127146 A * 5/2002

OTHER PUBLICATIONS

Computer-generated translation of JP 2002-127146 A (May 2002).*
Abstract of TW 594225 A (Jun. 2004).*
Abstract of KR 2006110905 A (Oct. 2006).*

* cited by examiner

*Primary Examiner*—John A. McPherson
(74) *Attorney, Agent, or Firm*—Winston Hsu

(57) ABSTRACT

A method for manufacturing a mold of a light guide plate is disclosed. The method includes following steps: providing a substrate and forming a plurality of microstructures on the substrate; depositing a first metal layer upon the substrate; spreading a photoresist layer on the first metal layer, exposing the photoresist layer to a photomask, and developing a photoresist pattern; removing a part of the first metal layer without cover of the photoresist pattern so as to form a sink pattern; depositing a second metal layer upon the sink pattern; electroforming a metal plate on the second metal layer; and remaining the metal plate and the second metal layer by separating the metal plate from the photoresist layer, the first metal layer, and the substrate so as to generate the mold of the light guide plate.

5 Claims, 7 Drawing Sheets

METHOD FOR MANUFACTURING A MOLD OF A LIGHT GUIDE PLATE

BACKGROUND OF THE INVENTION

1. Field of the Invention

The present invention relates to a method for manufacturing a mold of a light guide plate, and more particularly, to a method for manufacturing a mold of a light guide plate with a plurality of microstructures thereon.

2. Description of the Prior Art

Backlight units are known in the art. The backlight module, which is a key element in the liquid crystal displays (LCDs), is widely used in monitors, notebooks, digital cameras, projectors and so on. The light guide plate is one of the important parts of the backlight module. The light guide plate is capable of guiding light emitted from a light source so as to transform a point light source or a linear light source into a planar light source.

The methods of manufacturing the light guide plates are typically divided into two major categories: printing process and non-printing process. The non-printing process has advantages of stable quality, high precision, and so on, and is a mainstream manufacturing method of the light guide plates in the market. The non-printing process is to form patterns on a mold first and to manufacture the light guide plates by the mold with an injection molding process.

The methods of manufacturing the mold of the light guide plates are typically divided into two major categories. One is forming patterns on the mold directly with an etching process. The other is forming patterns on the mold with a semiconducting process, such as a photolithography process. For example, U.S. Pat. No. 5,776,636 discloses related technology. Please refer to FIG. 1 to FIG. 6 which are diagrams of manufacturing a mold of a light guide plate in the prior art. As shown in FIG. 1, a photoresist layer 11 is spread upon a substrate 10 first. The substrate 10 can be a glass substrate. As shown in FIG. 2 and FIG. 3, a photomask 12 with specified pattern thereon is utilized for forming a photoresist pattern on the substrate 10 with exposing and developing processes. As shown in FIG. 4, a metal layer 13 is plated upon the photoresist pattern with a sputtering process or an evaporation process. As shown in FIG. 5, a metal plate 14 is electroformed on the metal layer 13. As shown in FIG. 6, the metal layer 13 is separated from the photoresist layer 11 and the substrate 10 so as to generate a mold 15 with a pattern on the surface corresponding to the photoresist pattern.

However the conventional method of manufacturing the mold of the light guide plates has disadvantages as follows. A height of the pattern on the mold depends on a thickness of the photoresist layer 11, which causes difficulty in controlling the height of the pattern on the mold. In addition, the pattern on the mold is limited due to a small range of the thickness of the photoresist layer 11. Furthermore, the pattern on the mold is formed with exposing and developing processes so that microstructures or complicated structures can not be formed on the pattern.

SUMMARY OF THE INVENTION

It is therefore a primary objective of the claimed invention to provide a method for manufacturing a mold of a light guide plate with a plurality of microstructures thereon for solving the above-mentioned problem.

According to the claimed invention, a method for manufacturing a mold of a light guide plate includes following steps: providing a substrate and forming a plurality of microstructures on the substrate; depositing a first metal layer upon the substrate; spreading a photoresist layer on the first metal layer, exposing the photoresist layer to a photomask, and developing a photoresist pattern; removing a part of the first metal layer without cover of the photoresist pattern so as to form a sink pattern; depositing a second metal layer upon the sink pattern; electroforming a metal plate on the second metal layer; and remaining the metal plate and the second metal layer by separating the metal plate from the photoresist layer, the first metal layer, and the substrate so as to generate the mold of the light guide plate.

Other objectives, features and advantages of the present invention will be further understood from the further technology features disclosed by the present invention wherein there are shown and described preferred embodiments of this invention, simply by way of illustration of modes best suited to carry out the invention.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
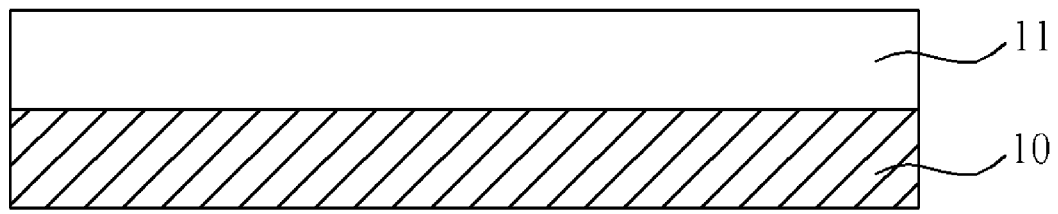
FIG. 1 to FIG. 6 are diagrams of manufacturing a mold of a light guide plate in the prior art.
Figure 2:
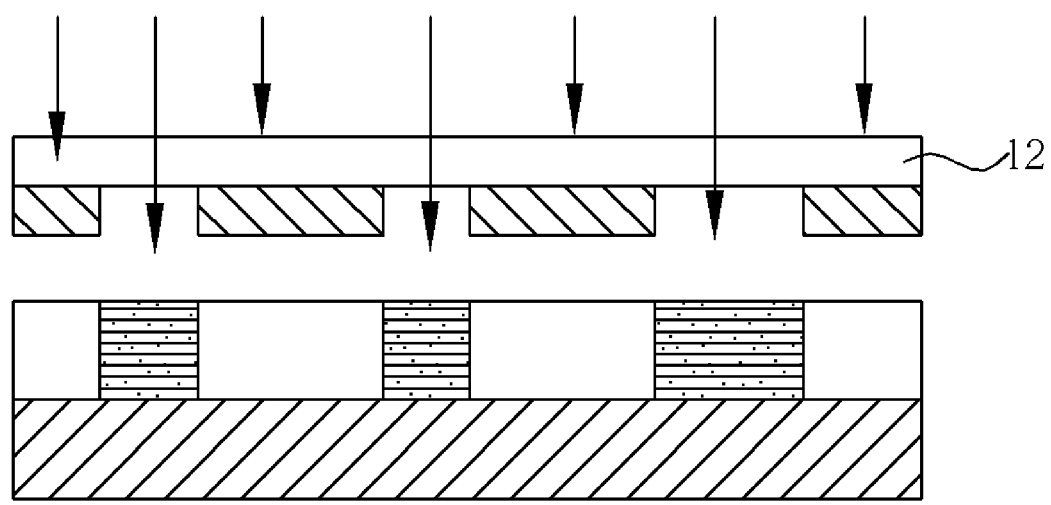
Figure 3:
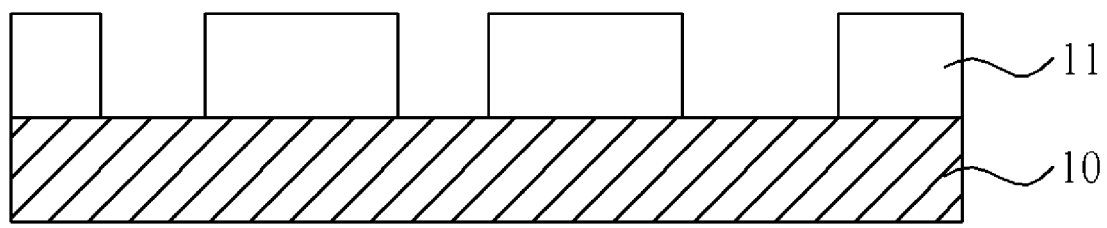
Figure 4:
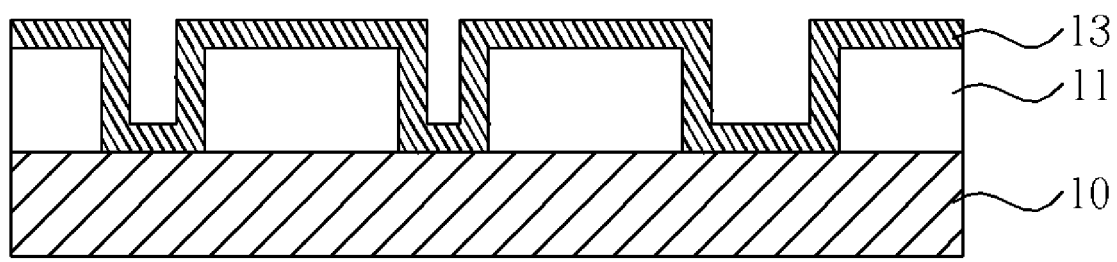
Figure 5:
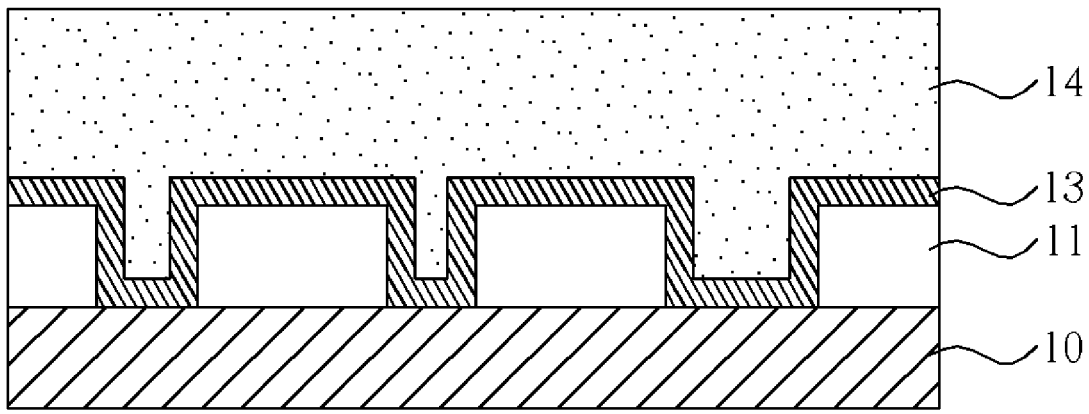
Figure 6:
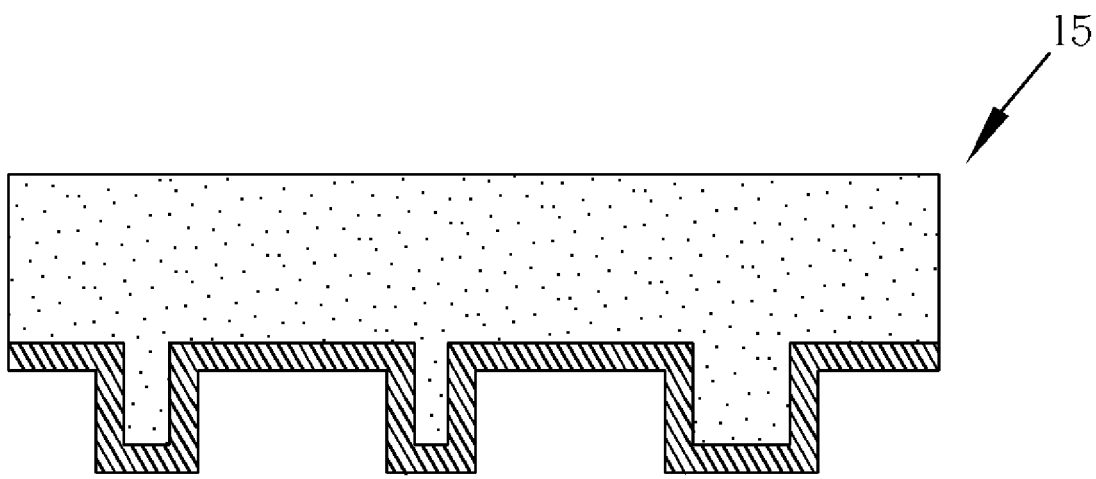
Figure 7:
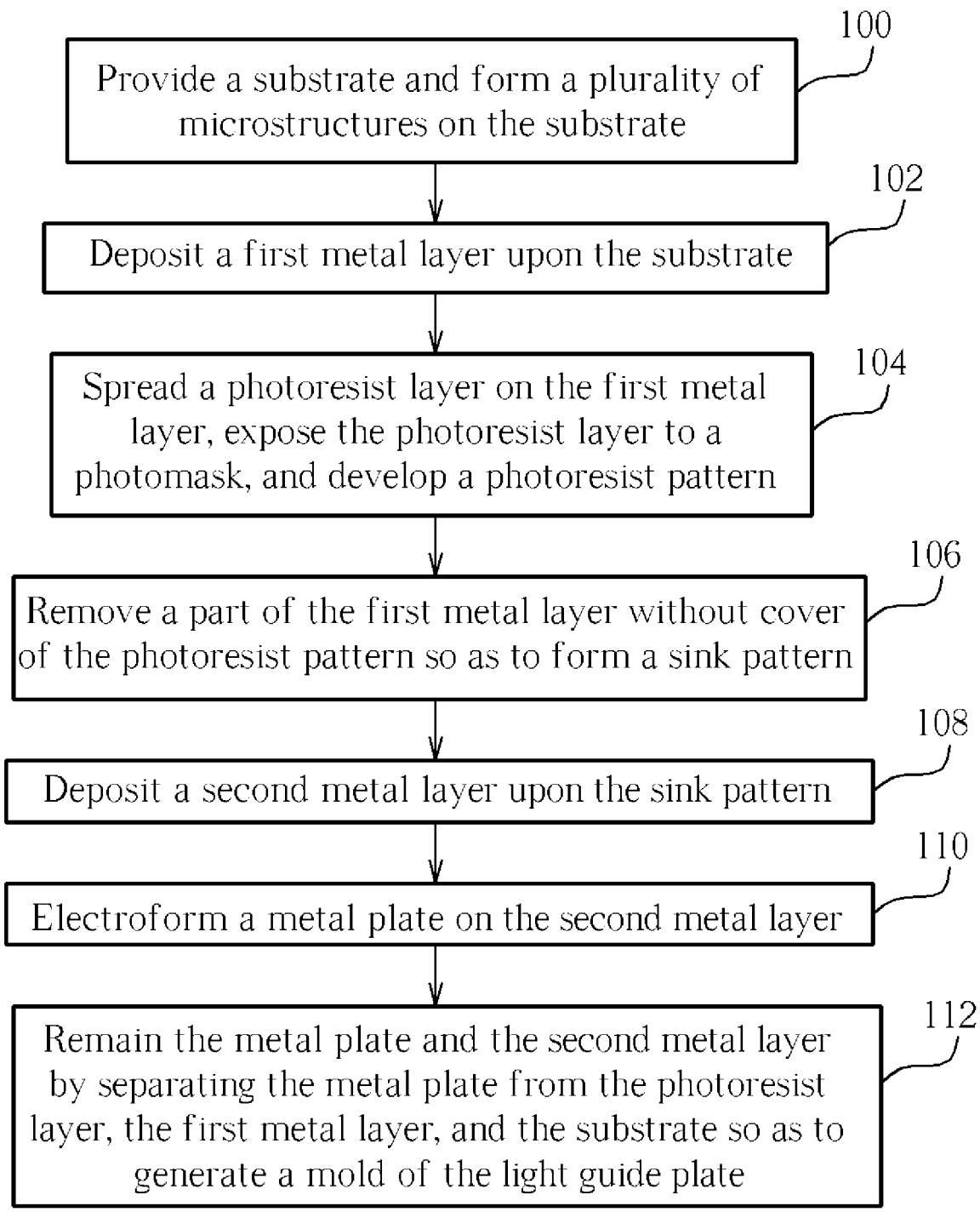
FIG. 7 is a flowchart of manufacturing a mold of a light guide plate according to a preferred embodiment of the present invention.

Please refer to FIG. 7 to FIG. 15. FIG. 7 is a flowchart of manufacturing a mold of a light guide plate according to a preferred embodiment of the present invention. FIG. 8 to FIG. 15 are diagrams of manufacturing the mold of the light guide plate according to the preferred embodiment of the present invention. The method of the present invention includes following steps:

Step 100: provide a substrate 20 and form a plurality of microstructures 201 on the substrate 20.

Step 102: deposit a first metal layer 21 upon the substrate 20.

Step 104: spread a photoresist layer 22 on the first metal layer 21, expose the photoresist layer 22 to a photomask 30, and develop a photoresist pattern 23.

Step 106: remove a part of the first metal layer 21 without cover of the photoresist pattern 23 so as to form a sink pattern 24.

Step 108: deposit a second metal layer 25 upon the sink pattern 24.

Step 110: electroform a metal plate 26 on the second metal layer 25.

Step 112: remain the metal plate 26 and the second metal layer 25 by separating the metal plate 26 from the photoresist layer 22, the first metal layer 21, and the substrate 20 so as to generate a mold 27 of the light guide plate.

Figure 8:
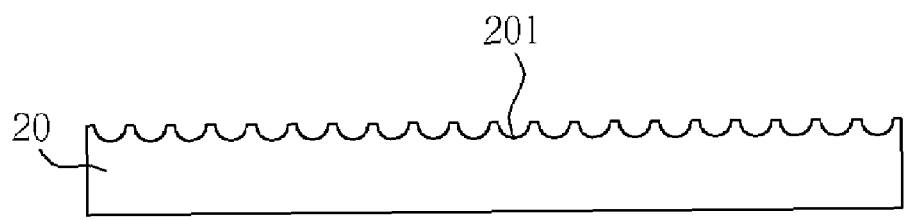
FIG. 8 to FIG. 15 are diagrams of manufacturing the mold of the light guide plate according to the preferred embodiment of the present invention.

The detailed description of above-mentioned steps is introduced as follows. As shown in FIG. 8, the substrate 20 is provided, and the plurality of microstructures 201 is formed on the substrate 20. The substrate 20 is made of, for example, metal material, such as stainless steel. The plurality of microstructures 201 on the substrate 20 are carved on the metal substrate with, for example, a micro-drill, a laser process, a mold process, or other mechanical process. The microstructure 201 is, for example, a semicircular microstructure, a trapezoid microstructure, a V-grooved microstructure, and so on.

Figure 9:
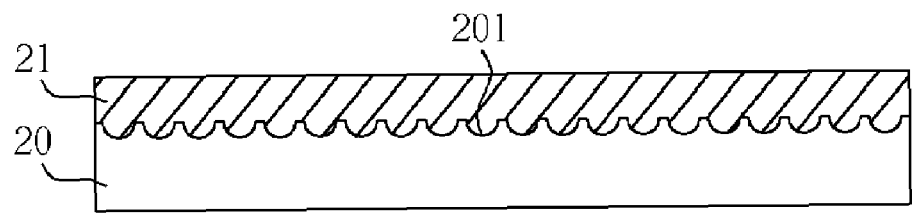

As shown in FIG. 9, the first metal layer 21 is deposited upon the substrate 20. For example, the first metal layer 21 is electroplated upon the substrate 20. A thickness of the first metal layer 21 has to be greater than a height of the microstructure 201. The first metal layer 21 is made of, for example, nickel, copper, and so on.

Figure 10:
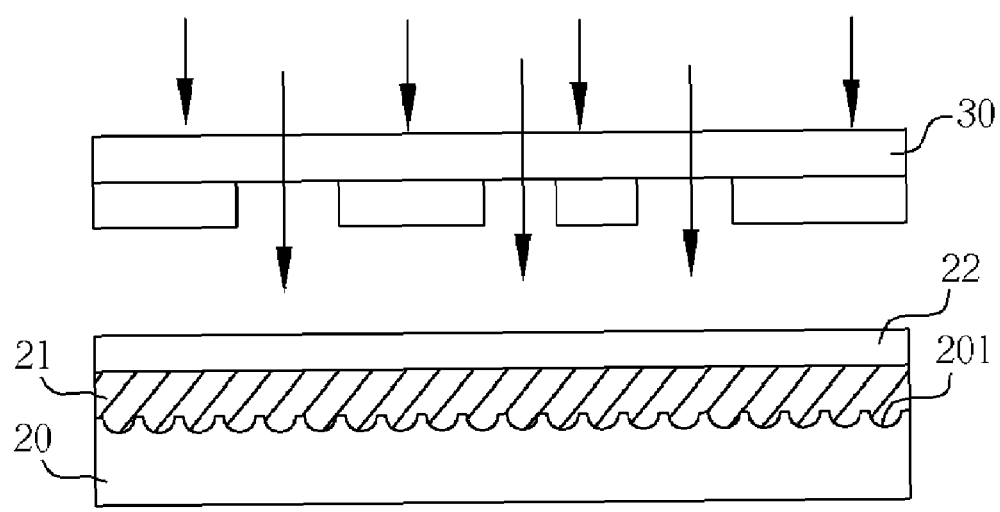
Figure 11:
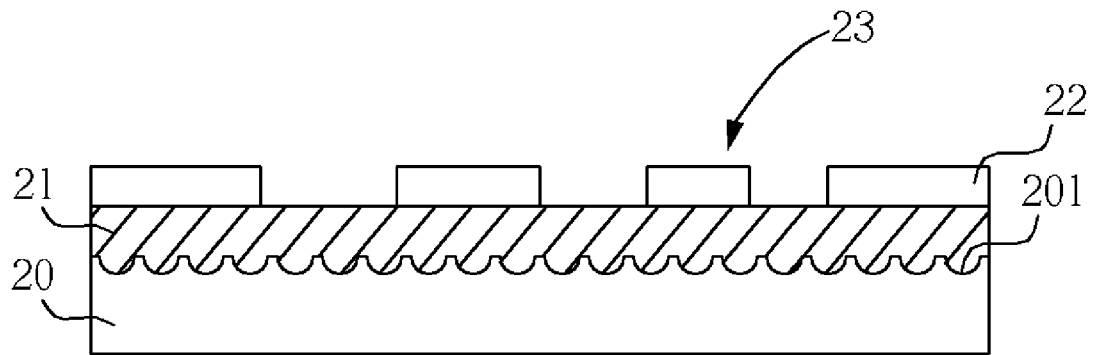

As shown in FIG. 10 and FIG. 11, the photoresist layer 22 is spread on the first metal layer 21. Then the photoresist layer 22 is exposed to the photomask 30, and the photoresist pattern 23 is developed. The thickness of the first metal layer 21 has to be greater than the height of the microstructure 201 so that the photoresist layer 22 is spread on the first metal layer 21 uniformly for preventing the un-uniform photoresist pattern 23.

Figure 12:
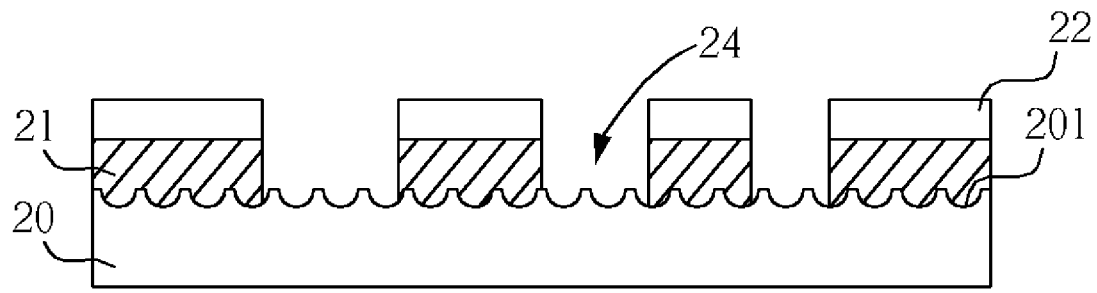
Figure 13:
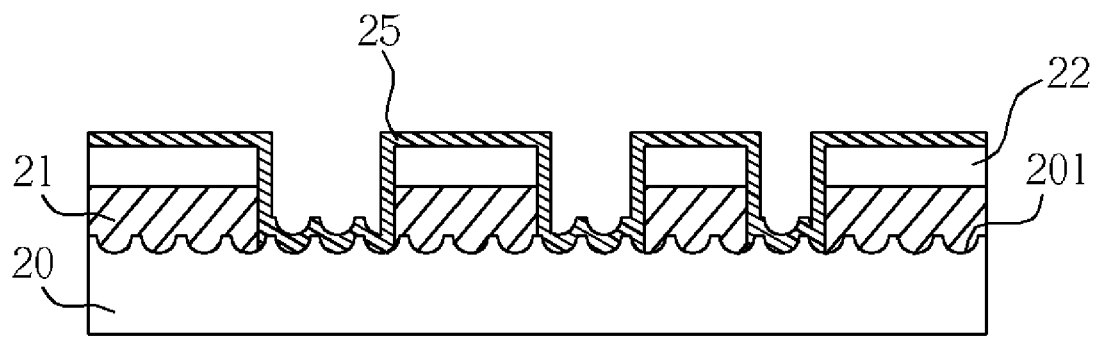

As shown in FIG. 12, a part of the first metal layer 21 without cover of the photoresist pattern 23 is removed so as to form the sink pattern 24. The part of the first metal layer 21 without cover of the photoresist pattern 23 is etched chemically so as to form the sink pattern 24. Therefore, some of the microstructures 201 are exposed. As shown in FIG. 13, the second metal layer 25 is deposited upon the sink pattern 24. The second metal layer 25 is deposited upon the sink pattern 24 with, for example, a sputtering process or a chemical coating process. The second metal layer 25 is made of, for example, cladding metal material, such as nickel or copper. The second metal layer 25 forms as an electroforming conductive layer.

Figure 14:
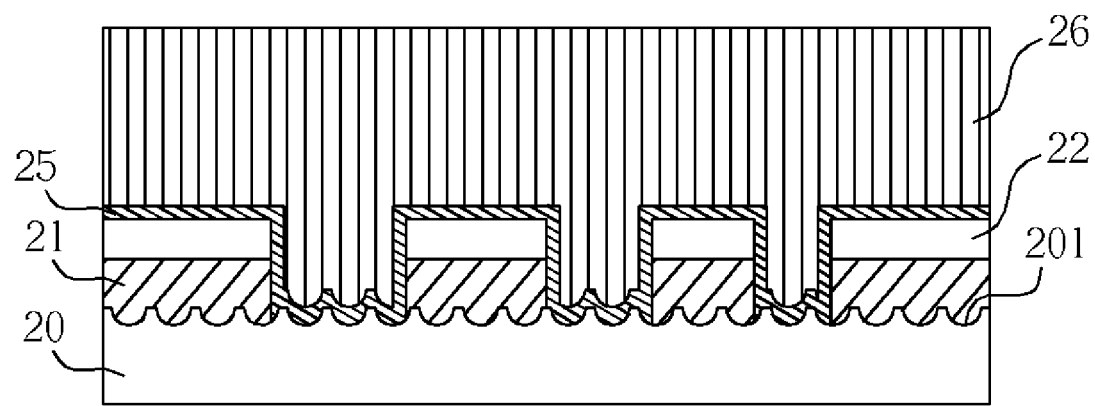
Figure 15:
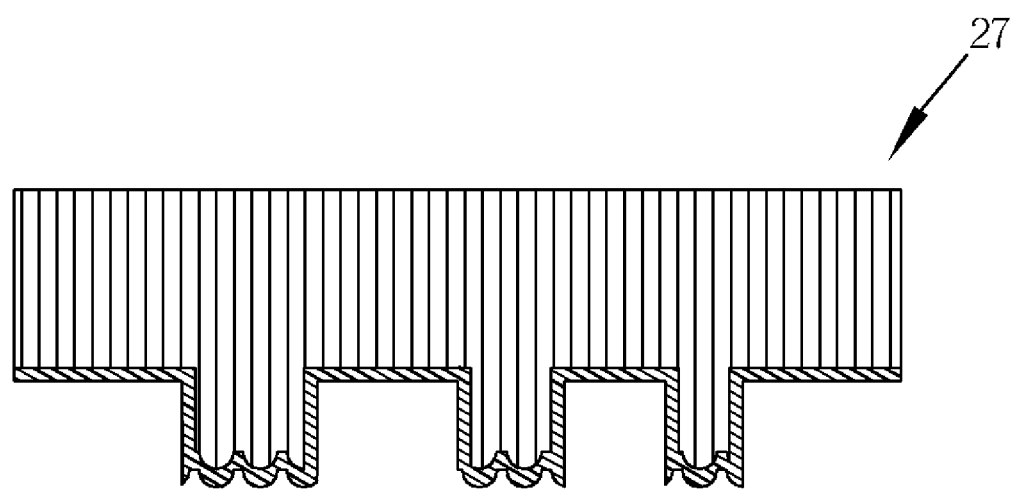

As shown in FIG. 14 and FIG. 15, the metal plate 26 is electroformed on the second metal layer 25. Then the metal plate 26 and the second metal layer 2 are remained, that is, the second metal layer 25 and the metal plate 26 are separated from the photoresist layer 22, the first metal layer 21, and the substrate 20 so as to generate the mold 27 of the light guide plate. The light guide plate with microstructures is generated with the mold 27 by an injection molding process.

In contrast to the prior art, the method for manufacturing the mold of the light guide plate according to the present invention has advantages that the height of the pattern on the mold does not depend on the thickness of the photoresist layer. Therefore, microstructures or complicated structures can be formed on the mold for manufacturing the light guide plate with corresponding microstructures or complicated structures.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for manufacturing a mold of a light guide plate, the method comprising:
   providing a substrate and forming a plurality of microstructures on the substrate;
   depositing a first metal layer upon the substrate;
   spreading a photoresist layer on the first metal layer, exposing the photoresist layer to a photomask, and developing a photoresist pattern;
   removing a part of the first metal layer without cover of the photoresist pattern so as to form a sink pattern;
   depositing a second metal layer upon the sink pattern;
   electroforming a metal plate on the second metal layer; and
   remaining the metal plate and the second metal layer by separating the metal plate from the photoresist layer, the first metal layer, and the substrate for generating the mold of the light guide plate.

2. The method of claim 1 wherein providing the substrate and forming the plurality of microstructures on the substrate comprises providing a metal substrate and forming the plurality of microstructures on the metal substrate with a micro-drill, a laser process, or a mold process.

3. The method of claim 1 wherein depositing the first metal layer upon the substrate comprises electroplating the first metal layer upon the substrate.

4. The method of claim 1 wherein depositing the second metal layer upon the sink pattern comprises depositing the second metal layer upon the sink pattern with a sputtering process or a chemical coating process.

5. The method of claim 1 wherein removing the first metal layer without cover of the photoresist pattern so as to form the sink pattern comprises etching the first metal layer without cover of the photoresist pattern chemically so as to form the sink pattern.

\* \* \* \* \*